United States Patent
Habuka et al.

[11] Patent Number: 5,885,346
[45] Date of Patent: Mar. 23, 1999

[54] SILICON SEMICONDUCTOR CRYSTAL AND A METHOD FOR MANUFACTURING IT

[75] Inventors: Hitoshi Habuka; Toru Otsuka, both of Annaka, Japan

[73] Assignee: Shin-Etsu Handotai Co., Ltd., Tokyo, Japan

[21] Appl. No.: 44,842

[22] Filed: Mar. 20, 1998

[30] Foreign Application Priority Data

Mar. 24, 1997 [JP] Japan ................................. 9-088891

[51] Int. Cl.$^6$ ................................................ C30B 25/04
[52] U.S. Cl. ........................... 117/104; 117/89; 117/90; 117/106
[58] Field of Search ........................ 117/58, 84, 89, 117/90, 91, 95, 104, 106

[56] References Cited

U.S. PATENT DOCUMENTS

| | | | |
|---|---|---|---|
| 5,028,560 | 7/1991 | Tsukamoto et al. | 438/482 |
| 5,397,738 | 3/1995 | Takagi | 117/89 |
| 5,643,826 | 7/1997 | Ohtani et al. | 438/162 |

*Primary Examiner*—Felisa Hiteshew
*Attorney, Agent, or Firm*—Ronald R. Snider

[57] ABSTRACT

Organic protective film 4 is directly adhered on the surface of silicon semiconductor crystal 1. Silicon semiconductor crystal 1 with organic protective film 4 is prepared by adhering organic protective film 4 on the surface of silicon semiconductor crystal substrate 1 on which oxide film 8 is formed, removing oxide film 8 to directly adhere organic protective film 4 on the surface of silicon semiconductor crystal 1, removing organic protective film 4 and then treating silicon semiconductor crystal 1.

15 Claims, 4 Drawing Sheets

SILICON SEMICONDUCTOR CRYSTAL AND A METHOD FOR MANUFACTURING IT

RELATED APPLICATION

This application claims the priority of Japanese Patent application No. 9-88891 filed on Mar. 24, 1997, which is incorporated herein by reference.

BACKGROUND OF THE INVENTION

1. Field of the Invention

The present invention relates in general to a silicon semiconductor crystal having a protective film which is a stable film and easy to remove, and more particularly to a method for manufacturing a silicon semiconductor crystal which features prevention of oxidation of surface of the silicon semiconductor crystal in a process for manufacturing semiconductor devices such as in the utilization of the surface of silicon semiconductor crystals.

It also relates to a method for forming a very thin silicon oxide film on the surface of a silicon semiconductor substrate.

It also relates to a method for manufacturing a high-quality silicon semiconductor crystal thin film.

2. Related Art

A natural oxide film of silicon with a thickness of 1.0–1.5 nm is usually formed on the silicon semiconductor crystal surface. When manufacturing semiconductor devices and such using the silicon semiconductor crystal, it is necessary to expose silicon atoms by completely removing the silicon oxide film and such which is covering the silicon semiconductors crystal surface.

Conventionally, methods which have been used to remove the oxide film formed on the silicon semiconductor crystal surface include a method in which the oxide film is removed by means of etching using an aqueous solution of hydrofluoric acid and such and a method in which the oxide film is removed by reduction in an hydrogen atmosphere at a high temperature, approximately 1,100° C.

In the method in which a silicon semiconductor crystal is cleaned with an aqueous Solution of hydrofluoric acid and rinsed with water to terminate the silicon semiconductor crystal surface with hydrogen atoms, the silicon semiconductor crystal surface is relatively stable against oxidation by air because it is covered or terminated with hydrogen atoms. However, as time goes on the oxidation of the silicon semiconductor crystal surface gradually proceeds and there are many cases where the quality of the semiconductor devices is degraded due to the fact that the next process is not conducted promptly within a few tens of seconds after the hydrogen termination and oxidation occurs before the process of actually using the silicon semiconductor crystal surface, such as growing a silicon semiconductor crystal thin film, takes place.

On the other hand, in the method in which the silicon semiconductor crystal is held in a hydrogen atmosphere at a high temperature of about 1,100° C. for a reducing treatment, there are cases of generation of slip dislocation due to thermal stress and deterioration of the dopant concentration distribution.

Such an oxide film which is formed due to oxidation of silicon by air always has a thickness of approximately 1.0–1.5 nm. However, as the semiconductor devices become more highly integrated, a very thin oxide film with an even thinner thickness of approximately 0.5–0.7 nm will be required in the future. It is impossible to form and maintain a thinner oxide film with the aforementioned conventional methods.

BRIEF SUMMARY OF THE INVENTION

The object of the present invention is to provide a silicon semiconductor crystal on which a protective film is formed wherein the protective film is more stable than protection given by terminating the silicon semiconductor crystal surface with hydrogen atoms and is easily removed before entering the process in which the silicon semiconductor crystal surface is used.

One aspect of the present invention provides a silicon semiconductor crystal prepared by directly adhering an organic protective film on the silicon semiconductor crystal surface.

Preferably, the thickness of the organic protective film is from 0.1 nm or more to 10 nm or less, and more preferably from 0.1 nm or more to 1 nm (or less).

Preferably, the organic protective film is an silicon oxide film containing an organic protective film material.

Preferably, the organic protective film contains a phthalic acid derivative. The phthalic acid derivative may be a phthalic ester. The phthalic ester may be diethyl phthalate or dioctyl phthalate.

Another aspect of the present invention provides a method for manufacturing a silicon semiconductor crystal comprising, in this order, a process in which an organic protective film is adhered to the silicon semiconductor crystal surface on which a silicon oxide film is formed, a process in which the silicon oxide film located between the organic protective film and the silicon semiconductor crystal is removed so the organic protective film directly adheres to the surface of the silicon semiconductor crystal, a process in which the organic protective film is removed and a process in which the silicon semiconductor crystal is treated.

Preferably, the silicon oxide film is removed by using an aqueous solution of hydrofluoric acid or hydrogen fluoride gas.

Preferably, the silicon semiconductor crystal on which the organic protective film is adhered is stored in an inert gas or in hydrogen gas between the process of directly adhering the organic protective film to the surface of the silicon semiconductor crystal and the process of removing the organic protective film.

Preferably, the silicon semiconductor crystal on which the organic protective film is adhered is held in an atmosphere containing oxygen to form a very thin silicon oxide film on the silicon semiconductor crystal, between the process of directly adhering the organic protective film to the surface of the silicon semiconductor crystal and the process of removing the organic protective film.

Preferably, the process of removing the organic protective film is conducted by having hydrogen chloride gas, hydrogen fluoride gas, chlorine gas or fluorine gas contact the silicon semiconductor crystal on which the organic protective film is adhered. More preferably, the process of removing the organic protective film is conducted by having hydrogen chloride gas with a concentration of 0.1–10% contact the silicon semiconductor crystal, heated up to 500°–800° C., for 1 second to 20 minutes. Further more preferably, the process of removing the organic protective film is conducted by having hydrogenic fluoride gas with a concentration of 0.1–10% contact the silicon semiconductor crystal, heated up to 600°–800° C., for 1 second to 10 minutes.

Preferably, a silicon semiconductor crystal thin film is formed on the silicon semiconductor crystal in the process of treating the silicon semiconductor crystal.

Preferably, the thickness of the organic protective film is from 0.1 nm or more to 10 nm or less, and more preferably from 0.1 nm or more to 1 nm or less.

Preferably, the organic protective film contains a phthalic acid derivative. The phthalic acid derivative may be a phthalic ester. The phthalic ester may be diethyl phthalate or dioctyl phthalate.

Still another aspect of the present invention provides a method for manufacturing a silicon semiconductor crystal comprising, in this order, a process in which a silicon semiconductor crystal is immersed in an aqueous solution with oxidizing capability containing an organic protective film material to form a silicon oxide film containing the organic protective film material on the surface of the silicon semiconductor crystal, a process in which silicon oxide in the silicon oxide film containing the organic protective film material is removed so the organic protective film directly adheres to the surface of the silicon semiconductor crystal, a process in which the organic protective film is removed and a process in which the silicon semiconductor crystal is treated.

Preferably, the aqueous solution with oxidizing capability is a mixed solution of aqueous ammonia and aqueous hydrogen peroxide or a mixed solution of hydrochloric acid and aqueous hydrogen peroxide.

Preferably, the organic protective film contains a phthalic acid derivative.

Still another aspect of the present invention provides a method of manufacturing a silicon semiconductor crystal comprising, in this order, a process in which a silicon semiconductor crystal on whose surface no silicon oxide film is formed is treated in an aqueous solution which essentially lacks the oxidizing capability to adhere an organic protective film directly to the surface of the silicon semiconductor crystal, a process in which the organic protective film is removed and a process in which the silicon semiconductor crystal is treated.

According to the present invention, oxidation of the surface of a silicon semiconductor crystal substrate can be suppressed prevented for a long time by removing silicon oxide film on silicon semiconductor crystal substrate, forming an organic protective film using derivatives of phthalic acid such as dioctyl phthalate and diethyl phthalate for the organic protective film material and storing in air, in an inert gas or in hydrogen gas. Organic protective film can be removed by using hydrogen chloride gas, hydrogen fluoride gas, chlorine gas or fluorine gas. This allows easy transition to a process where semiconductor devices and such are fabricated. This method can be used for growing a silicon semiconductor crystal thin film to lower the growth temperature. Also, a very thin silicon oxide film can be formed by adjusting the oxidation action.

DETAILED DESCRIPTION OF THE INVENTION

Further details of the present invention are described below.

The inventors discovered a method for protecting the silicon semiconductor crystal surface in which, after removing the oxide film on the silicon semiconductor crystal surface, a film to protect the silicon semiconductor crystal surface from oxidation is adhered. This method is more stable than protection by terminating the silicon semiconductor crystal surface with hydrogen atoms and also allows easy removal of the protection before entering the processes in which the surface of the silicon semiconductor crystals is used.

For the oxidation protection film, an organic thin film composed of, for example, a phthalic acid derivative such as dioctyl phthalate or diethyl phthalate is used. By storing the silicon semiconductor crystal in air, inert gas or hydrogen gas after adhering the protective film on the surface, oxidation of the silicon semiconductor crystal surface can be suppressed or prevented and the surface with an extremely thin oxide film formed on it or without any oxide film can be maintained.

Adhesion of the protective film on the silicon semiconductor crystal surface is implemented by, after adhering a protective film on the surface of the oxide film of the surface of the silicon semiconductor crystal, using hydrogen fluoride gas or a hydrofluoric acid solution to remove the oxide film which exists between the protective film and the silicon semiconductor crystal surface. It may also be implemented by formation of an oxide film containing the organic substance which is to be the protective film, followed by the removal of the silicon oxide by using hydrogen fluoride gas or a hydrofluoric acid solution.

Since the protective film adhered to the surface of a silicon semiconductor crystal surface efficiently suppresses the permeation of oxygen molecules present in the atmosphere, the oxidation rate of the silicon semiconductor crystal surface becomes very low and a very thin oxide film can be formed. Also, in a process of manufacturing a semiconductor device by utilizing a silicon semiconductor crystal surface, complete removal of the protective film adhered to the silicon semiconductor crystal surface is carried out by using hydrogen chloride gas, hydrogen fluoride gas, chlorine gas or fluorine gas.

When a silicon semiconductor crystal thin film is grown by using the silicon semiconductor crystal thus manufactured, a reduction in the process temperature is realized and the problem of the generation of slip dislocation due to thermal stress and deterioration of the distribution of the dopant is solved.

Since the organic protective film covers the silicon semiconductor crystal surface without chemically acting on the silicon semiconductor crystal surface, the silicon semiconductor crystal surface can be stably maintained while preventing oxidation. If the silicon semiconductor crystal is stored in an atmosphere which contains only a trace amount of oxygen, the silicon semiconductor crystal surface can be stably maintained for a long time while oxidation is prevented. If it is kept in an atmosphere which contains a suitable amount of oxygen then a very thin oxide film, which is even thinner than a normally formed oxide film, will form. After the suppression of oxidation and or control of oxidation is done, the organic protective film can be easily removed by hydrogen chloride gas or hydrogen fluoride gas and the process of manufacturing a semiconductor device can proceed without any problems.

EXAMPLES

Examples of the present invention are described below by referring to drawings. First, the method for adhering an organic protective film on the surface of the silicon semiconductor crystal substrate is described.

Example 1

Figure 2A:
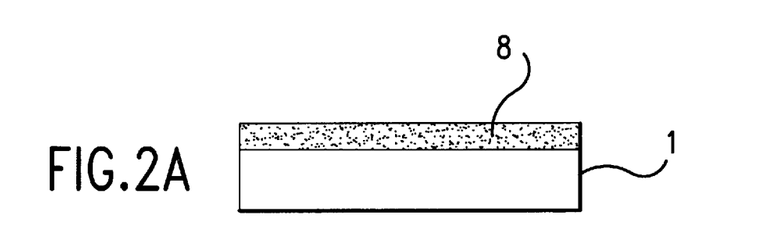
FIGS. 2A to 2C are cross sections showing silicon semiconductor crystal substrate 1 on whose surface organic protective film 4 or and silicon oxide film 8 is formed.

As shown in FIG. 2A, the present invention can be implemented by adding a process of adhering an organic protective film 4 at the end of or after the completion of a process in which a silicon semiconductor crystal substrate 1 with a natural oxide film 8 formed on its surface is cleaned. To clean the surface of silicon semiconductor crystal substrate 1 by removing stains and such, a mixed solution of aqueous ammonia and aqueous hydrogen peroxide and a mixed solution of hydrochloric acid and aqueous hydrogen peroxide (hereafter these are generically referred to as a "cleaning solution") are generally used. After silicon semiconductor crystal substrate 1 is immersed in these cleaning solutions and cleaned, it is further cleaned by being immersed in pure water or distilled water (hereafter, these are generically referred to as "pure water").

Figure 1:
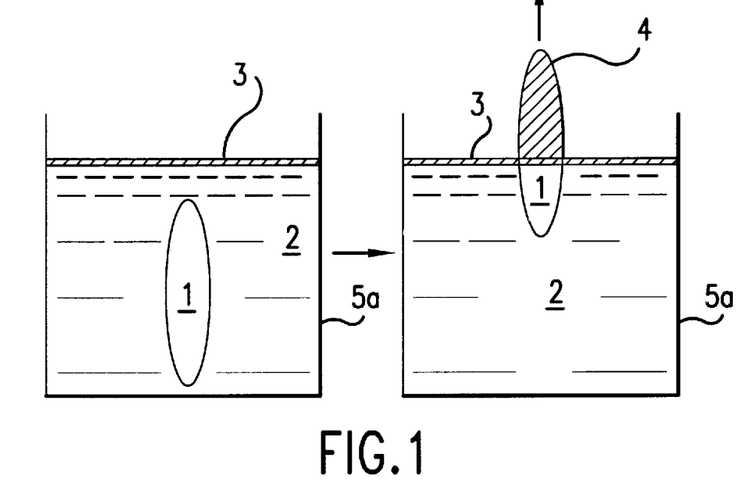
FIG. 1 is an illustration showing a method for adhering the organic protective film during the cleaning process.
Figure 2B:
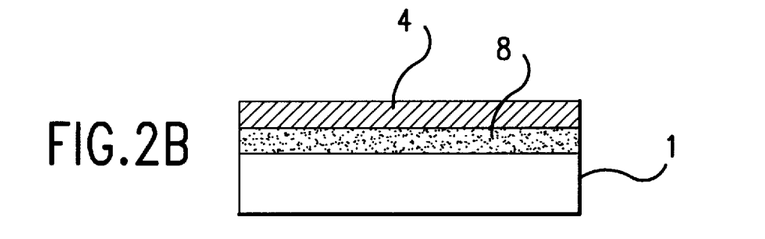

For implementing this example, at the end of the process of cleaning with pure water, as shown in FIG. 1, an organic protective film material 3 such as dioctyl phthalate is added and floated on the surface of pure water 2 in a liquid phase treatment vessel 5a, and silicon semiconductor crystal substrate 1 which is immersed in pure water 2 is pulled up so it passes the water surface. This is when organic protective film material 3 such as dioctyl phthalate adheres to the surface of silicon semiconductor crystal substrate 1. Organic protective film 4 is thus formed on natural oxide film 8, as shown in FIG. 2B.

Figure 2C:
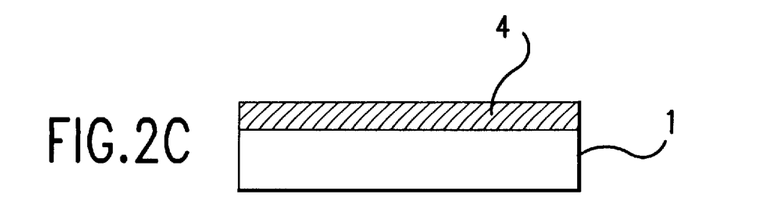

In the last process after the process in which silicon semiconductor crystal substrate 1 is cleaned by removing stains and such on the surface, a hydrofluoric acid solution is used to remove natural oxide film 8 and then, as shown in FIG. 2C, silicon semiconductor crystal substrate 1 can be pulled up from pure water 2, on which the added organic protective film material such as dioctyl phthalate floats, so it passes through the water surface to directly adhere organic protective film 4 on the surface which is covered with silicon atoms or hydrogen fluorine atoms on silicon semiconductor crystal substrate 1. The minimum amount of dioctyl phthalate required to form an organic protective film 4 composed of dioctyl phthalate with a thickness of 0.2 nm on the surface of silicon semiconductor crystal substrate 1 with a diameter of 200 mm is 0.0124 mg.

The thickness of the liquid film formed by floating organic protective film material 3 composed of dioctyl phthalate on the liquid surface in liquid phase treatment vessel 5 is preferably 0.2 nm or more. If the required weight of dioctyl phthalate calculated by:

(area of the liquid surface in liquid phase treatment vessel 5a)×(0.2 nm)×(density of dioctyl phthalate (0.9861) is less than 0.0124 mg, it is necessary to add more than 0.0124 mg.

It is also possible to first add organic protective film material 3 such as dioctyl phthalate to the cleaning solution and then proceed with the cleaning process using this cleaning solution. Although part of the dioctyl phthalate is decomposed, silicon oxide film 8 with organic protective film material 3 mixed in can be formed on the surface of silicon semiconductor crystal substrate 1.

A method of directly adhering organic protective film 4 on silicon semiconductor crystal substrate 1 by removing silicon oxide film 8 after forming organic protective film 4 via natural oxide film 8 on silicon semiconductor crystal substrate 1 is described below.

Example 2

Figure 3:
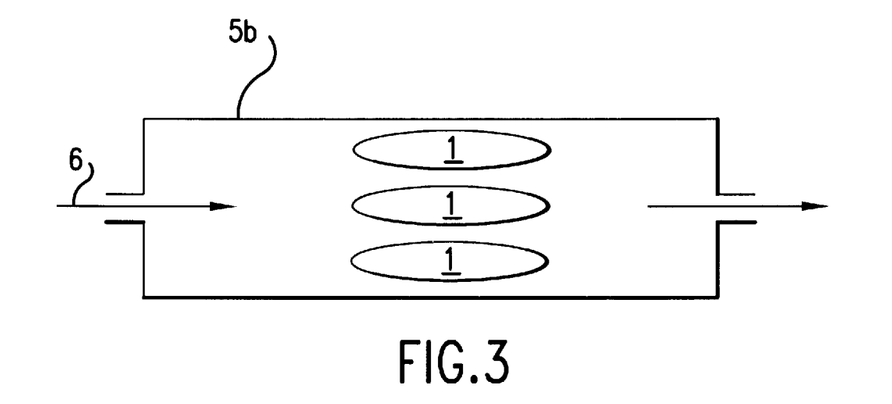
FIG. 3 is an illustration showing a method for treating silicon semiconductor crystal substrate 1 using a vapor phase treatment apparatus.
Figure 4:
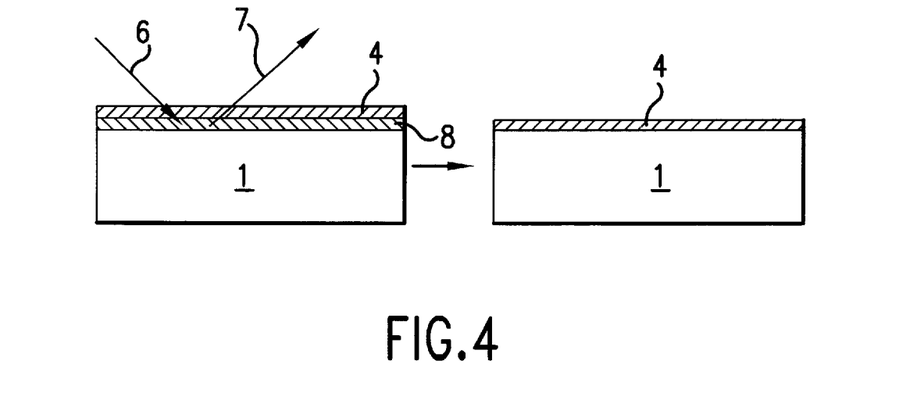
FIG. 4 is an illustration showing the mechanism of removal of silicon oxide film 8 using hydrogen fluoride gas or an aqueous solution of hydrogen fluoride.

Silicon semiconductor crystal substrate on which organic protective film 4 has been formed via natural oxide film 8 is placed in a vapor phase treatment chamber 5b of a vapor phase treatment apparatus shown in FIG. 3 and gas 6 containing 0.01–10% hydrogen fluoride is introduced to vapor phase treatment chamber 5b so silicon semiconductor crystal substrate 1 is exposed to it. An exposure temperature in the range of 0°–100° C. is acceptable, and in this example it was room temperature. As shown in FIG. 4, the reaction with gas 6 containing hydrogen fluoride which has permeated through organic protective film 4 produces the reaction products 7 (believed to be silicon tetrafluoride and water), which are then vaporized and diffused/discharged into the vapor phase. Since organic protective film 4 is not corroded by gas 6 containing hydrogen fluoride molecules, it is left on the surface of silicon semiconductor crystal substrate 1. As a result, it is possible to obtain silicon semiconductor crystal substrate 1 with organic protective film 4 directly adhered on its surface from which natural oxide film 8 has been completely removed.

Example 3

While Example 2 is a method which uses a vapor phase treatment, a method using a liquid phase treatment is also possible. This can be done by immersing silicon semiconductor crystal substrate 1 with organic protective film 4 in a 1% hydrofluoric acid solution, for example, for approximately 2 minutes. The reaction product 7 (believed to be silicon tetrafluoride) produced by the reaction with hydrogen fluoride molecules which have permeated through organic protective film 4 is dissolved and diffused discharged into the liquid phase. Since organic protective film 4 is not corroded by hydrogen fluoride molecules, it is left on the surface of silicon semiconductor crystal substrate 1. As a result, it is possible to obtain silicon semiconductor crystal substrate 1 with organic protective film 4 directly adhered on its surface from which natural oxide film 8 has been completely removed.

Evaluation of characteristics of the organic protective film

In order to verify the effect of organic protective film 4 to suppress and prevent oxidation, the following measurement was conducted. Silicon semiconductor crystal substrate 1 to whose surface a 0.2 nm-thick diethyl phthalate, which is organic protective film 4, was directly adhered according to the method describe above (sample A) and silicon semiconductor crystal substrate 1 without organic protective film 4 (sample B) were let stand in a mixed gas of oxygen and nitrogen with the same composition as air and an ellipsometer was used to measure time dependent changes in the film thickness of natural oxide film 8 on the surface of silicon semiconductor crystal substrate 1. Using sample A which was protected by diethyl phthalate, the same measurement was carried out for cases where the sample was let stand in a mixed gas of 10% oxygen and 90% nitrogen, in nitrogen gas, in an inert gas such as argon gas and in hydrogen gas.

The results of the measurements described above are shown in FIG. 5. The results indicate the following: when let stand in the mixed gas with the same composition as air for approximately 14 days, the thickness of natural oxide film 8 of sample B which did not have organic protective film 4 returned to a value comparable to that of before the cleaning, but, in the case of sample A whose surface was protected by diethyl phthalate, i.e. organic protective film 4, with a thickness of 0.1 nm or more, after 14 days the formation of natural oxide film 8 stopped at the thickness 0.5 nm thinner than the thickness before the cleaning. It is thus proven that organic protective film 4 suppresses the formation of natural oxide film 8 and this makes it possible to form a very thin silicon oxide film 8 with a thickness of approximately 0.5–0.7 nm.

If the thickness of organic protective film 4 is thinner than 0.1 nm, then the ratio of oxygen molecules which permeate through the organic protective film 4 increases rapidly and the film does not function as a protective film. Organic protective film 4 with a thickness of 0.1 nm or more can suppress the formation of natural oxide film 8 and a thickness of 1 nm will be sufficient. It is not practical to use organic protective film 4 with a thickness more than 10 nm, because then hydrogen chloride gas has to be introduced for 20 minutes or more to remove the organic protective film 4. Therefore, the preferable thickness of the organic protective film 4 is 10 nm or less.

Figure 5:
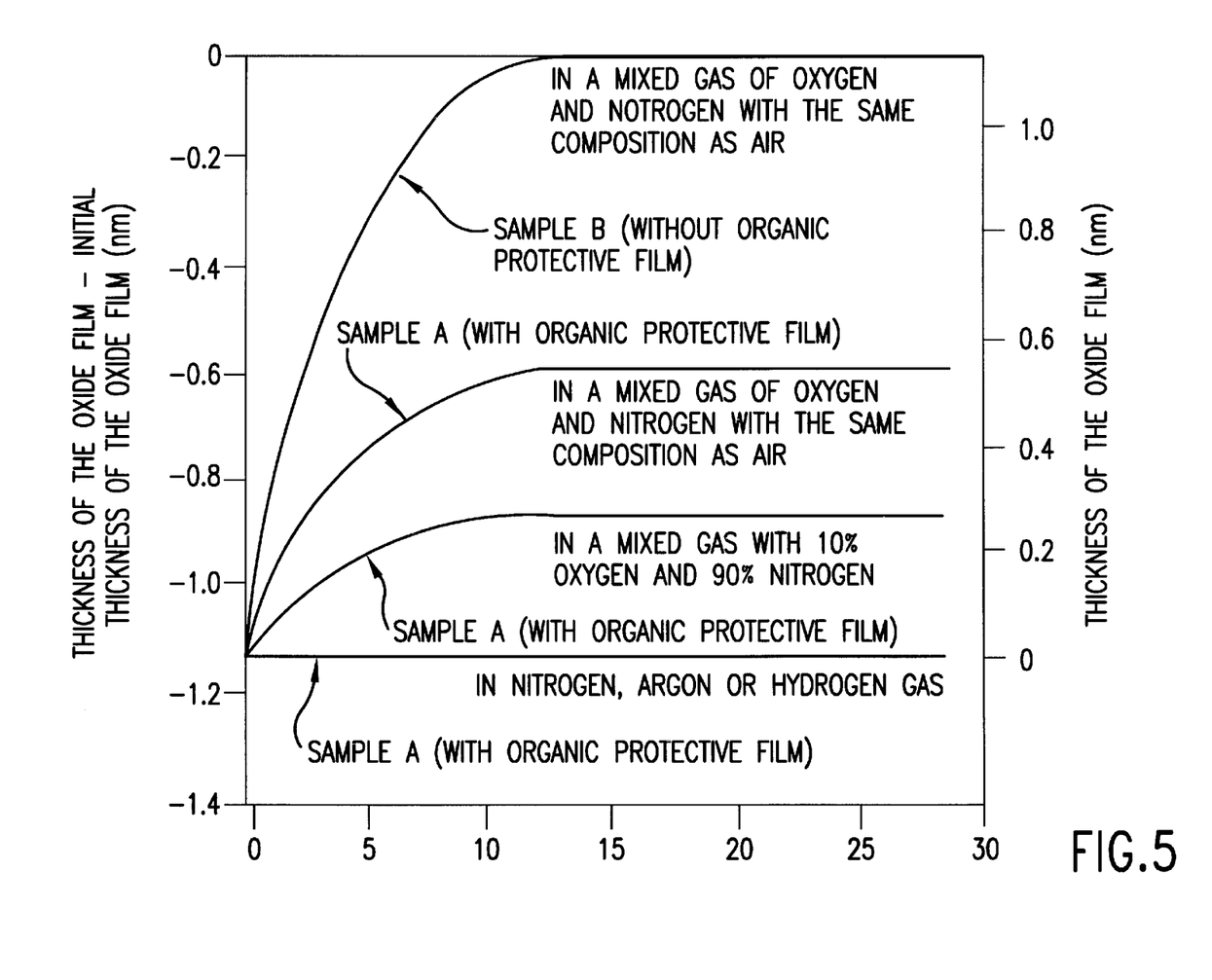
FIG. 5 is a graph showing changes in the oxide film thickness over time in various atmospheres.

As shown in FIG. 5, it was possible to form an even thinner silicon oxide film 8 by allowing sample A which was protected by dioctyl phthalate to stand in a mixed gas of 10% oxygen and 90% nitrogen. As mentioned above, the typical thickness of natural oxide film 8 naturally formed due to the effect of hydrogen peroxide during cleaning or from the air was 1.0–1.5 nm and therefore it was difficult to form silicon oxide film 8 thinner than this. However, the present invention can achieve this goal with excellent reproducibility.

What is described above is a case where a very thin silicon oxide film 8 was formed. When nitrogen gas, an inert gas such as argon gas or hydrogen gas was used for the ambient gas for storage to prevent oxidation by further increasing the oxidation suppression effect, it was verified that the formation of silicon oxide film 8 did not proceed at all in any of these conditions. Also, when the vapor phase growth of a silicon single crystal thin film was carried out on silicon single crystal substrate 1 at 800° C. after removing organic protective film 4, the surface of the thin film was observed to be in good condition. Therefore, it was concluded that organic protective film 4 prevented oxidation due to a trace amount of oxygen and moisture present in nitrogen gas, an inert gas such as argon gas and hydrogen gas.

A silicon semiconductor crystal substrate 1 which was protected by organic protective film 4 according to the method described above was let stand in air for 24 hours and then the surface of the silicon semiconductor crystal substrate 1 was analyzed with the X-ray photo-electron spectroscopy analysis method. This analysis did not detect any oxygen atoms bonded to silicon atoms, indicating that oxidation hardly proceeded in 24 hours. This suggests that a certain amount of time is required to develop conditions which allow oxygen molecules to permeate through organic protective film 4 to let oxidation proceed.

On the other hand, an increase in the oxide film thickness was also not detected after storing sample B which did not have organic protective film 4 in nitrogen gas, in an inert gas such as argon (gas and in hydrogen gas. However, when the vapor phase growth of a silicon single crystal thin film was carried out on silicon single crystal substrate 1 at 800° C. after removing organic protective film 4, minute unevenness generally called surface roughness occurred on the surface of the thin film. Therefore, it was concluded that silicon single crystal substrate 1 was partially oxidized by a trace amount of oxygen and moisture present in nitrogen gas, in the inert gas such as argon gas and in hydrogen gas.

As described thus far, in the present invention organic protective film 4 is effective in protecting the surface of silicon semiconductor crystal substrate 1 from oxidation or from forming a very thing oxide film. After achieving these goals, it is necessary to completely remove organic protective film 4 which is covering the surface of silicon semiconductor crystal substrate 1 and expose the silicon atoms. A method of removing organic protective film 4 is described below.

One method of removing organic protective film 4 is to use hydrogen chloride gas, hydrogen fluoride gas, chlorine gas or fluorine gas to remove organic protective film 4. In the methods in which organic protective film 4 is adhered to silicon semiconductor crystal 1, particularly the method which is implemented while oxidation is prevented, the surface of silicon semiconductor crystal substrate 1 and organic protective film 4 are in direct contact and therefore it is known that silicon carbide is formed by the reaction between the surface of silicon semiconductor crystal substrate 1 and organic protective film 4 if careless high temperature heating is attempted. The formation of silicon carbide can proceed even at a temperature around 750° C. Therefore, a method of removing organic protective film 4 at around 700° C. is described below.

Example 4

First, an example using hydrogen chloride gas is described. Silicon semiconductor crystal substrate 1 with organic protective film 4 was placed in vapor phase treatment chamber 5b of the vaporphase treatment apparatus shown in FIG. 3. For gas 6 to be fed into vapor phase treatment chamber 5b, 99 liters minute of hydrogen gas was introduced. The vapor phase treatment chamber 5b was then irradiated with infrared light from outside to increase the temperature of silicon semiconductor crystal substrate 1 up to 700° C. At this time, 1 liter minute of hydrogen chloride gas was introduced for 1 minute to form an atmosphere with 1% hydrogen chloride. The hydrogen chloride gas was shut off, the temperature was lowered by discontinuing the infrared light irradiation, and then silicon semiconductor crystal substrate 1 was removed.

The surface of silicon semiconductor crystal substrate 1 thus removed was analyzed using the X-ray photo-electron spectroscopy analysis method. Carbon atoms and oxygen atoms were not detected and thus complete removal of organic protective film 4 was verified. Needless to say, silicon oxide was not detected either.

Detailed investigation of the conditions of hydrogen chloride introduction revealed that organic protective film 4 was removed in one second or more with a concentration of 0.1% or more at 800° C. At 700° C., organic protective film 4 was removed in ten seconds or more with a concentration of 0.1% or more. At 600° C., organic protective film 4 was removed in 60 seconds or more with a concentration of 0.1% or more. When the concentration of hydrogen chloride gas is 10% or more, the surface of silicon semiconductor crystal substrate 1 may become hazy. Introducing hydrogen chloride for more than 20 minutes only decreases productivity with no positive effect. Introducing hydrogen chloride at 500° C. or lower has no practical value because then the process takes a very long time.

Example 5

Next, an example using hydrogen fluoride gas is described. Silicon semiconductor crystal substrate 1 with organic protective film 4 was placed in vapor phase treatment chamber 5b of the vapor phase treatment apparatus shown in FIG. 3. For gas 6 to be fed into vapor phase treatment chamber 5b, 99 liters minute of hydrogen gas was introduced. The vapor phase treatment chamber 5b was then irradiated with infrared light from outside to increase the temperature of silicon semiconductor crystal substrate 1 up to 700° C. At this time, 1 liter/minute of hydrogen fluoride gas was introduced for 1 minute to form an atmosphere with 1% hydrogen fluoride. The hydrogen fluoride gas was shut off, the temperature was lowered by discontinuing the infrared light irradiation, and then silicon semiconductor crystal substrate 1 was removed.

The surface of silicon semiconductor crystal substrate 1 thus removed was analyzed using the X-ray photo electron spectroscopy analysis method. Carbon atoms and oxygen atoms were not detected and thus complete removal of organic protective film 4 was verified. Needless to say, silicon oxide was not detected either.

Detailed investigation of the conditions of hydrogen fluoride introduction revealed that organic protective film 4 was removed in one second or more with a concentration of 0.1% or more at 800° C. At 700° C., organic protective film 4 was removed in three seconds or more with a concentration of 0.1% or more. At 600° C., organic protective film 4 was removed in 20 seconds or more with a concentration of 0.1% or more. When the concentration of hydrogen fluoride gas is 5% or more, the surface of silicon semiconductor crystal substrate 1 may become hazy. Introducing hydrogen fluoride for more than 20 minutes only decreases productivity with no positive effect. Introducing hydrogen fluoride at 600° C. or lower has no practical value because then the process takes a very long time.

The examples pertaining to removal of organic protective film 4 described above are cases where organic protective film 4 is directly formed on the surface of silicon semiconductor crystal substrate 1. It has also been verified that the removal of organic protective film 4 formed on a very thin oxide film can be performed exactly in the same way. Experiments conducted under the same conditions as the aforementioned examples confirmed that the methods of removing organic protective film 4 described in the aforementioned examples are also useful effective in removing inadvertently adhered organic contaminants other than the targeted organic substance of organic protective film 4. While the aforementioned examples pertaining to the removal of organic protective film 4 use hydrogen chloride gas or hydrogen fluoride gas, halogen type gases such as chlorine gas or fluorine gas are also effective.

In the description above, infrared light was used to heat silicon semiconductor crystal substrate 1. Needless to say, resistance heating or high-frequency heating can also be used. Silicon semiconductor crystal substrates 1 can be treated either individually or in batches.

Example 6

A process in which vapor phase growth of a silicon single crystal thin film is carried out on the surface of silicon single crystal substrate 1 is described here as an example of a process of treating silicon semiconductor crystals using the processes described above. For the apparatus, a vapor phase growth apparatus shown in FIG. 6, for example, is used. This apparatus is equipped with an infrared lamp 9 outside of a quartz glass vapor phase treatment chamber 5b to heat silicon single crystal substrate 1 placed in vapor phase treatment chamber 5b. Hydrogen gas, hydrogen fluoride gas, hydrogen chloride gas and trichlorosilane gas are introduced via a mass flow controller (MFC) and gas 6 thus formed is introduced into vapor phase treatment chamber 5b. Gas 6 flows over silicon single crystal substrate 1 and then discharges from the right side of vapor phase treatment chamber 5b.

As an example of a method of forming organic protective film 4, the following method was implemented. A p-type silicon single crystal substrate 1 with a diameter of 200 mm was cleaned with a mixed solution of aqueous ammonia and aqueous hydrogen peroxide and a mixed solution of hydrochloric acid and hydrogen peroxide, and then pulled up through pure water with dioctyl phthalate floating on it to adhere a 0.2 nm thick dioctyl phthalate on the surface of silicon single crystal substrate 1 to form organic protective film 4.

Figure 6:
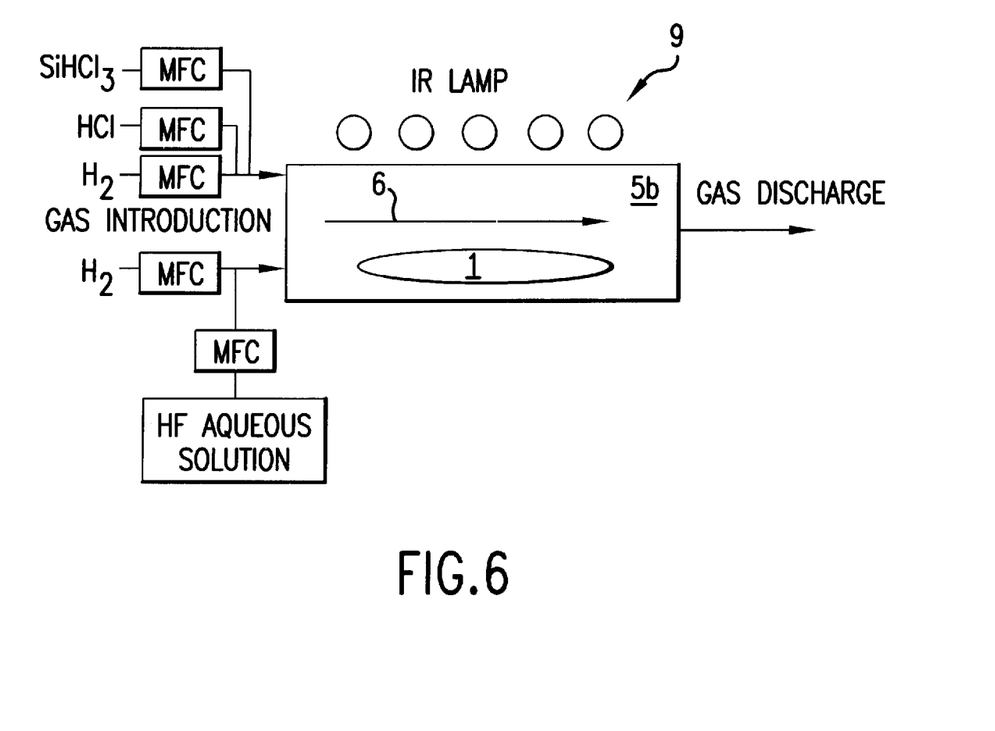
FIG. 6 is a simplified configuration of a silicon semiconductor crystal thin film growth apparatus.

This p-type silicon single crystal substrate 1 with a diameter of 200 mm was placed in vapor phase treatment chamber 5b. Without turning on infrared lamp 9, at room temperature, hydrogen gas was introduced into vapor phase treatment chamber 5b at a flow rate of 99.5 liters minute to replace the atmosphere in vapor phase treatment chamber 5b with a hydrogen gas atmosphere. After complete replacement with the hydrogen gas atmosphere, hydrogen fluoride gas was fed at 0.5 liters minute for 5 minutes with infrared lamp 9 still turned off. Silicon single crystal substrate 1 was kept at room temperature, which was 23° C. when this example was implemented. By this procedure, natural oxide film 8 on the surface of silicon single crystal substrate 1 was completely removed and the surface was directly covered with a dioctyl phthalate film. At the same time, oxidation was prevented completely by keeping it in hydrogen gas.

Hydrogen fluoride gas was then shut off and infrared lamp 9 was turned on to raise the temperature up to 700° C., still in a hydrogen atmosphere. When the temperature reached 700° C., the flow rate of hydrogen gas was set at 99 liter minute and 1 liter minute of hydrogen chloride gas was introduced for 1 minute.

This procedure completely removed the dioctyl phthalate film on the surface of silicon semiconductor crystal substrate 1.

Hydrogen chloride gas was shut off and the power of infrared lamp 9 was adjusted (increased) to raise the temperature up to 800° C., still in the hydrogen atmosphere. After the temperature reached 800° C., the flow rate of hydrogen gas was adjusted to 98 liter minute and 12 g/minute (2 liter minute) of trichloro silane gas was introduced for 20 minutes. By this procedure, a silicon single crystal thin film with a thickness of approximately 1 micrometer was formed on silicon single crystal substrate 1.

The supply of trichlorosilane gas was shut off and infrared lamp 9 was turned off while the supply of hydrogen gas was still kept on to lower the temperature of silicon single crystal substrate 1 down to room temperature. The gas supply was switched from hydrogen to nitrogen to replace the inside of vapor phase treatment chamber 5b with a nitrogen atmosphere, and then silicon single crystal substrate 1 was removed.

The surface of the silicon single crystal thin film formed on the surface of silicon single crystal substrate 1 was a very good mirror surface. This indicates that the natural oxide film which existed before the substrate was placed in vapor phase treatment chamber 5b was removed by hydrogen fluoride gas and that the phthalic diester film was also removed just before growing the silicon single crystal thin film to form a very good silicon single crystal thin film. Since the growth temperature of the silicon single crystal thin film was 800° C., which was relatively low, slip dislocations due to thermal stress were not observed and the deterioration of the dopant concentration distribution was at a negligible level.

For the organic protective film material 3 to form organic protective film 4 which has the effects described above, diethyl phthalate or dioctyl phthalate, which are derivatives of phthalic acid, is used in the description above. However other derivatives of phthalic acid can also be used. Needless to say, any organic compound with a boiling point higher than room temperature can serve as organic protective film material 3.

In the present invention, hydrogen fluoride gas and an aqueous solution of hydrogen fluoride to remove the silicon oxide film. Although an alcohol solution of hydrogen fluoride is effective for removing silicon oxide, other solutions should be chosen because the alcohol solution will also remove the organic protective film.

While the description above uses single crystals for the silicon semiconductor crystals, the same effects can be obtained with polycrystal or amorphous silicon.

what is claimed is:

1. A method for manufacturing a silicon semiconductor crystal comprising, in this order, a process in which an organic protective film is adhered to the silicon semiconductor crystal surface on which a silicon oxide film is formed, a process in which said silicon oxide film located between said organic protective film and said silicon semiconductor crystal is removed so said organic protective film directly adheres to the surface of said silicon semiconductor crystal, a process in which said organic protective film is removed and a process in which said silicon semiconductor crystal is treated.

2. A method for manufacturing a silicon semiconductor crystal according to claim 1 wherein said silicon oxide film is removed by using an aqueous solution of hydrofluoric acid or hydrogen fluoride gas.

3. A method for manufacturing a silicon semiconductor crystal according to claim 1 wherein said silicon semiconductor crystal on which said organic protective film is adhered is stored in an inert gas or in hydrogen gas between the process of directly adhering said organic protective film to the surface of said silicon semiconductor crystal and the process of removing said organic protective film.

4. A method for manufacturing a silicon semiconductor crystal according to claim 1 wherein, between the process of directly adhering said organic protective film to the surface of said silicon semiconductor crystal and the process of removing said organic protective film, said silicon semiconductor crystal on which said organic protective film is adhered is held in an atmosphere containing oxygen to form a very thin silicon oxide film on said silicon semiconductor crystal.

5. A method for manufacturing a silicon semiconductor crystal according to claim 1 wherein the process of removing said organic protective film is conducted by having hydrogen chloride gas, hydrogen fluoride gas, chlorine gas or fluorine gas contact said silicon semiconductor crystal on which said organic protective film is adhered.

6. A method for manufacturing a silicon semiconductor crystal according to claim 5 wherein the process of removing said organic protective film is conducted by having hydrogen chloride gas with a concentration of 0.1–10% contact said silicon semiconductor crystal, heated up to 500°–800° C., for 1 second to 20 minutes.

7. A method for manufacturing a silicon semiconductor crystal according to claim 5 wherein the process of removing said organic protective film is conducted by having hydrogen fluoride gas with a concentration of 0.1–10% contact said silicon semiconductor crystal, heated up to 600°–800° C., for 1 second to 10 minutes.

8. A method for manufacturing a silicon semiconductor crystal according to claim 1 wherein the process of treating said silicon semiconductor crystal is a process in which a silicon semiconductor crystal thin film is formed on said silicon semiconductor crystal.

9. A method for manufacturing a silicon semiconductor crystal according to claim 1 wherein the thickness of said organic protective film is from 0.1 nm to 10 nm.

10. A method for manufacturing a silicon semiconductor crystal according to claim 9 wherein said organic protective film contains a phthalic acid derivative.

11. A method for manufacturing a silicon semiconductor crystal according claim 10 wherein said phthalic acid derivative is a phthalic ester.

12. A method for manufacturing a silicon semiconductor crystal comprising, in this order, a process in which a silicon semiconductor crystal is immersed in an aqueous solution with oxidizing capability containing an organic protective film material to form a silicon oxide film containing said organic protective film material on the surface of said silicon semiconductor crystal, a process in which silicon oxide in said silicon oxide film containing said organic protective film material is removed so said organic protective film directly adheres to the surface of said silicon semiconductor crystal, a process in which said organic protective film is removed and a process in which said silicon semiconductor crystal is treated.

13. A method for manufacturing a silicon semiconductor crystal according to claim 12 wherein said aqueous solution with oxidizing capability is a mixed solution of aqueous ammonia and aqueous hydrogen peroxide or a mixed solution of hydrochloric acid and aqueous hydrogen peroxide.

14. A method for manufacturing a silicon semiconductor crystal according to claim 12 wherein said organic protective film contains a phthalic acid derivative.

15. A method for manufacturing a silicon semiconductor crystal comprising, in this order, a process in which a silicon semiconductor crystal on whose surface no silicon oxide film is formed is treated in an aqueous solution which essentially lacks the oxidizing capability to adhere an organic protective film directly to the surface of said silicon semiconductor crystal, a process in which said organic protective film is removed and a process in which said silicon semiconductor crystal is treated.

* * * * *